United States Patent [19]

Gillig et al.

[11] Patent Number: 4,550,426
[45] Date of Patent: Oct. 29, 1985

[54] METHOD AND MEANS OF DETECTING THE PRESENCE OF A SIGNAL REPRESENTING VOICE AND OF COMPRESSING THE LEVEL OF THE SIGNAL

[75] Inventors: Steven F. Gillig, Carol Stream; George H. Fergus, Schaumburg, both of Ill.; Michael F. Barnes, Mendon, N.Y.

[73] Assignee: Motorola, Inc., Schaumburg, Ill.

[21] Appl. No.: 680,444

[22] Filed: Dec. 11, 1984

Related U.S. Application Data

[63] Continuation of Ser. No. 336,191, Dec. 31, 1981, abandoned.

[51] Int. Cl.[4] ............................................. G10L 1/00
[52] U.S. Cl. ...................................... 381/46; 381/106
[58] Field of Search ................... 381/46, 47, 104–110; 375/30; 333/14; 330/86

[56] References Cited

U.S. PATENT DOCUMENTS

| | | | |
|---|---|---|---|
| 3,321,581 | 5/1967 | Zryd et al. | 381/107 |
| 3,967,209 | 6/1976 | Skoures et al. | 330/86 |
| 4,000,369 | 12/1976 | Paul et al. | 381/46 |
| 4,066,976 | 1/1978 | Dickopp et al. | 330/86 |
| 4,112,384 | 9/1978 | Buckberger | 381/107 |
| 4,249,042 | 2/1981 | Orban | 381/106 |

*Primary Examiner*—E. S. Matt Kemeny
*Attorney, Agent, or Firm*—Donald B. Southard; Thomas G. Berry

[57] ABSTRACT

A circuit that combines the functions of audio compression and voice detection comprises an amplifier in a negative-feedback configuration in which the feedback signal is the product of the output of the amplifier and a syllabic voltage derived from that output. The syllabic voltage is compared with a threshold level to provide an output that is a measure of the presence of a voice signal. In an alternate embodiment, the syllabic voltage is compared with the sum of a threshold level and a detected syllabic voltage to generate a signal that is a measure of the presence of voice. The syllabic detector may be either an averaging detector or a valley detector.

10 Claims, 6 Drawing Figures

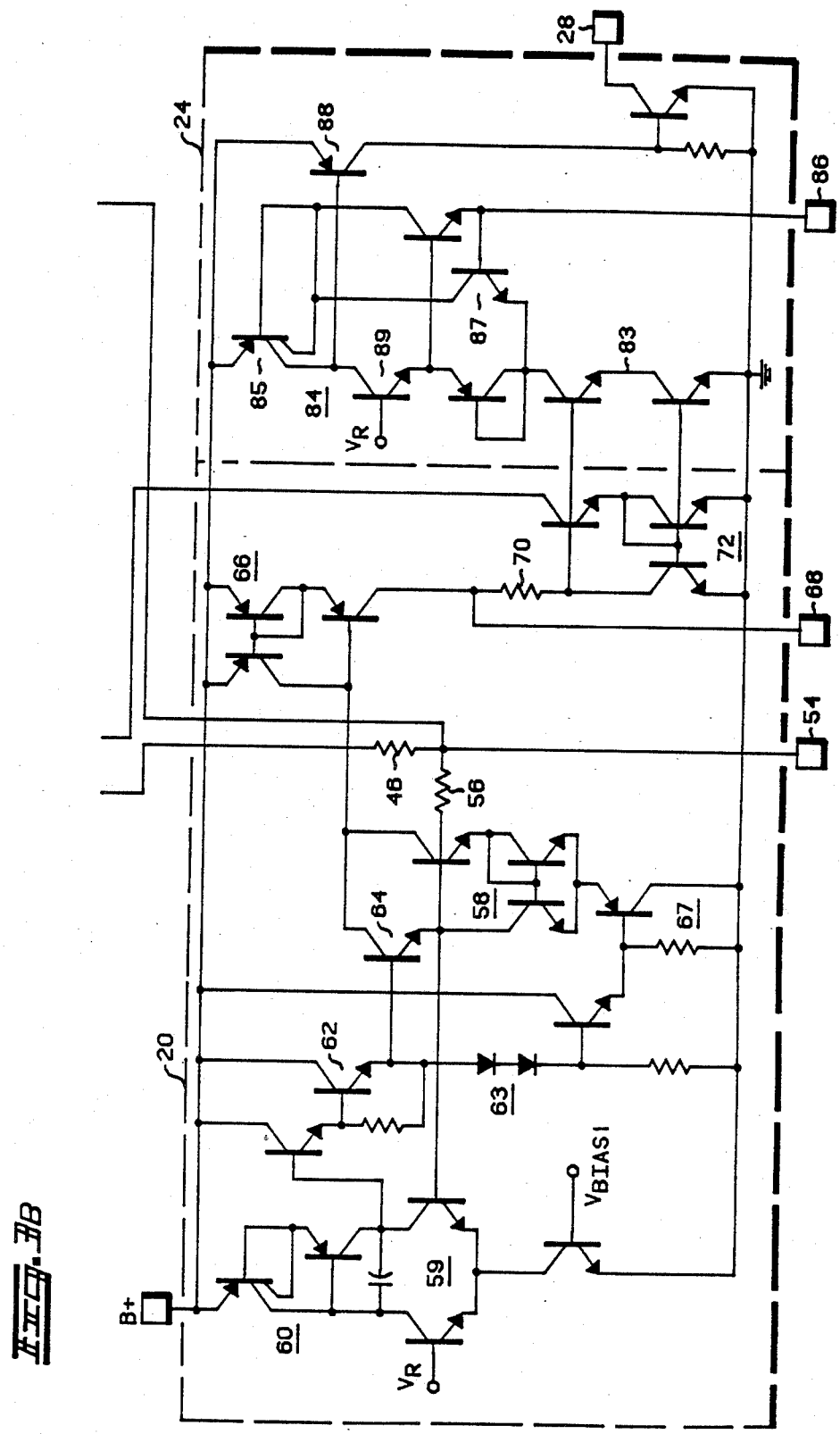

4,550,426

METHOD AND MEANS OF DETECTING THE PRESENCE OF A SIGNAL REPRESENTING VOICE AND OF COMPRESSING THE LEVEL OF THE SIGNAL

This is a continuation of application Ser. No. 06/336,191, filed Dec. 31, 1981, now abandoned.

BACKGROUND OF THE INVENTION

This invention relates to signal processing in a radio transmitter. In particular, it relates to methods and means of compressing a voice signal before transmission and of detecting the presence of a voice signal for purposes such as controlling transmission.

Two features that are well known in transmitters designed for two-way radios are audio compression and voice-operated transmission (VOX). Audio compression is reduction of the dynamic range of a signal by applying the signal to some nonlinear circuit that reduces the magnitude of variations of power level about the average to increase the understandability of a received signal that contains noise. VOX is a well-known means of controlling the operation of a transmitter in response to a detected audio signal. The two functions are nominally independent of one another and are normally carried out by separate circuits. This becomes a disadvantage in circuits designed for very large-scale integration (VLSI). In such circuits the reliability and yield are functions of the surface area of the semiconductor chip used to make the circuit. Reliability and yield are both improved with smaller circuits. It is, therefore, an important goal of the designer to reduce the number of components and hence reduce the area of the semiconductor chip.

It is an object of the present invention to provide improved operation of a voice-operated transmitter.

It is a further object of the present invention to combine in one circuit the functions of audio compression and detection of the presence of a voice signal.

Other objects will become apparent in the course of a detailed description of the invention.

SUMMARY OF THE INVENTION

A circuit that combines the functions of audio compression and voice detection comprises an amplifier in a negative-feedback configuration in which the feedback signal is the product of the output of the amplifier and a syllabic voltage derived from that output. The syllabic voltage is compared with a threshold level to provide an output that is a measure of the presence of a voice signal. In an alternate embodiment, the syllabic voltage is compared with the sum of a threshold level and a detected syllabic voltage to generate a signal that is a measure of the presence of voice. The syllabic detector may be either an averaging detector or a valley detector.

DETAILED DESCRIPTION OF THE INVENTION

Figure 1:
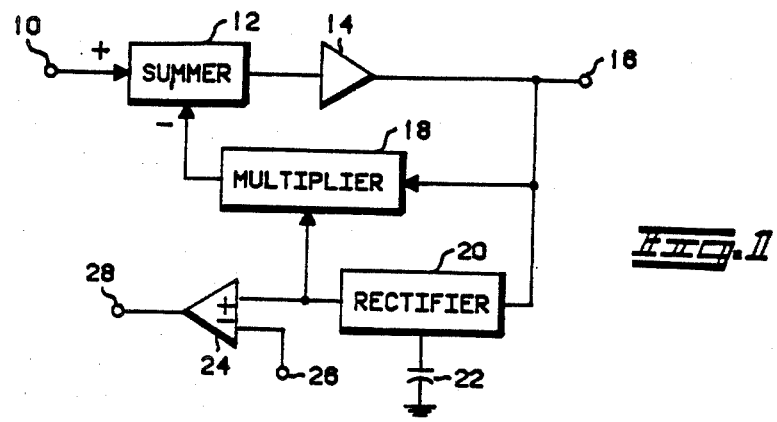
FIG. 1 is a functional block diagram of a circuit for the practice of the present invention.

FIG. 1 is a block diagram of a circuit for the practice of the present invention. In FIG. 1, terminal 10 receives an electrical analog of a voice signal. The signal at terminal 10 is applied to a summer 12, then to an amplifier 14, the output of which is taken to terminal 16 as the compressed output of the circuit. The output of amplifier 14 is also applied to a multiplier 18 and a rectifier 20. A filter capacitor 22 is connected to rectifier 20 to provide a time constant that is of the order of the lengths of syllables in speech. For this reason, the filtered output of rectifier 20 is referred to as a syllabic voltage. The syllabic voltage is taken as an input to multiplier 18 where it is multiplied with the output of amplifier 14. The product of these signals is the output of multiplier 18 which is subtracted from the signal at terminal 10 in summer 12 to provide a composite input signal to amplifier 14. The product of the output of amplifier 14 with the syllabic voltage derived from that output provides a negative-feedback signal for amplifier 14 that compresses the volume. The rectifier 20 and the capacitor 22 serve to rectify and syllabically filter the compressor output to produce the syllabic voltage. The signal compression occurs through the following relationships. The multiplier 18 produces an output which is the product of the syllabic voltage and the voltage at the terminal 16 ($V_{out}$). Since the voltage produced by the rectifier 20 ($V_{out\,ave}$) corresponds to the average envelope of the compressor output voltage, the multiplier 18 output voltage is proportional to the $ABS(V_{out\,ave}) \times V_{out}$. The high gain amplifier 14 serves to keep the multiplier output voltage approximately equal to $V_{in} \times V_{out}$ which subsequently is a compressed version of $V_{in}$. The syllabic voltage may also be used to indicate the presence of a voice signal in the input to terminal 10. When voice is applied at terminal 10, the syllabic voltage at the output of rectifier 20 is larger than it would be in the absence of voice. When that syllabic voltage is applied to a comparator 24 and there compared with a threshold signal at terminal 26, the output of comparator 24 provides at terminal 28 a binary indication of the presence of voice at terminal 10. This can be used to control VOX in a transmitter or it can be used in other circuits that require an indication of the presence of voice.

Figure 2:
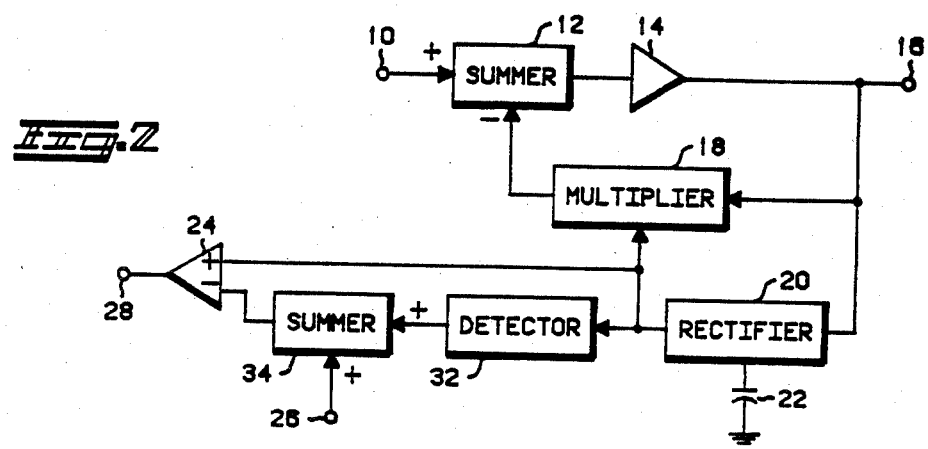
FIG. 2 is a functional block diagram of an alternate embodiment of the circuit of FIG. 1.

FIG. 2 is an alternate embodiment of a circuit for the practice of the invention which combines voice compression with an adaptive threshold for determining the presence of voice in the signal. In FIG. 2, as in FIG. 1, a signal that may contain voice components is applied at terminal 10. The combination of summer 12, amplifier 14, multiplier 18, rectifier 20, and capacitor 22 comprises a voice compressor identical to that of FIG. 1. The syllabic voltage from rectifier 20 is applied both to comparator 24 and to detector 32. This may be an averaging detector or a valley detector, producing as an output a voltage to be applied to summer 34. An averaging detector is a circuit that provides an output proportional to the average of its input over many cycles. A valley detector is a circuit that provides an output that rises slowly toward a higher value of input and drops rapidly to a lower value of input. Each contains information about the past history of the signal. A reference voltage representing a fixed threshold is applied at terminal 26. The output of summer 34 is the sum of the voltage at terminal 26 and the output of detector 32. The output of summer 34 is thus an adaptive threshold which is compared in comparator 24 with the syllabic voltage to produce at terminal 28 a binary indication of the presence or absence of a voice signal at terminal 10.

Figure 4:
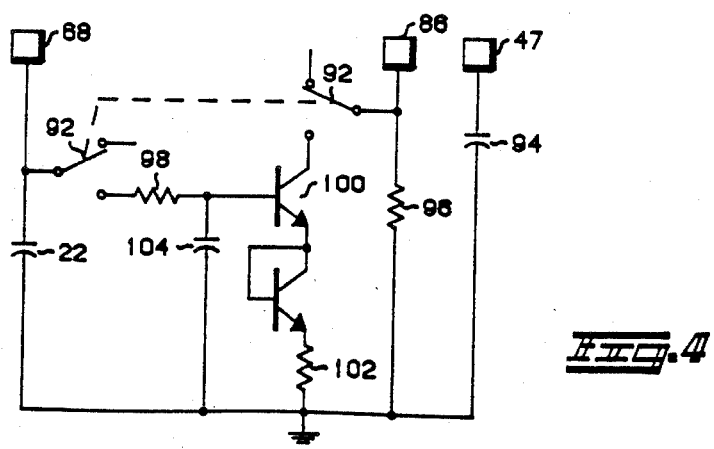
FIG. 4 is a circuit for external connection to FIG. 3.
Figure 3A:
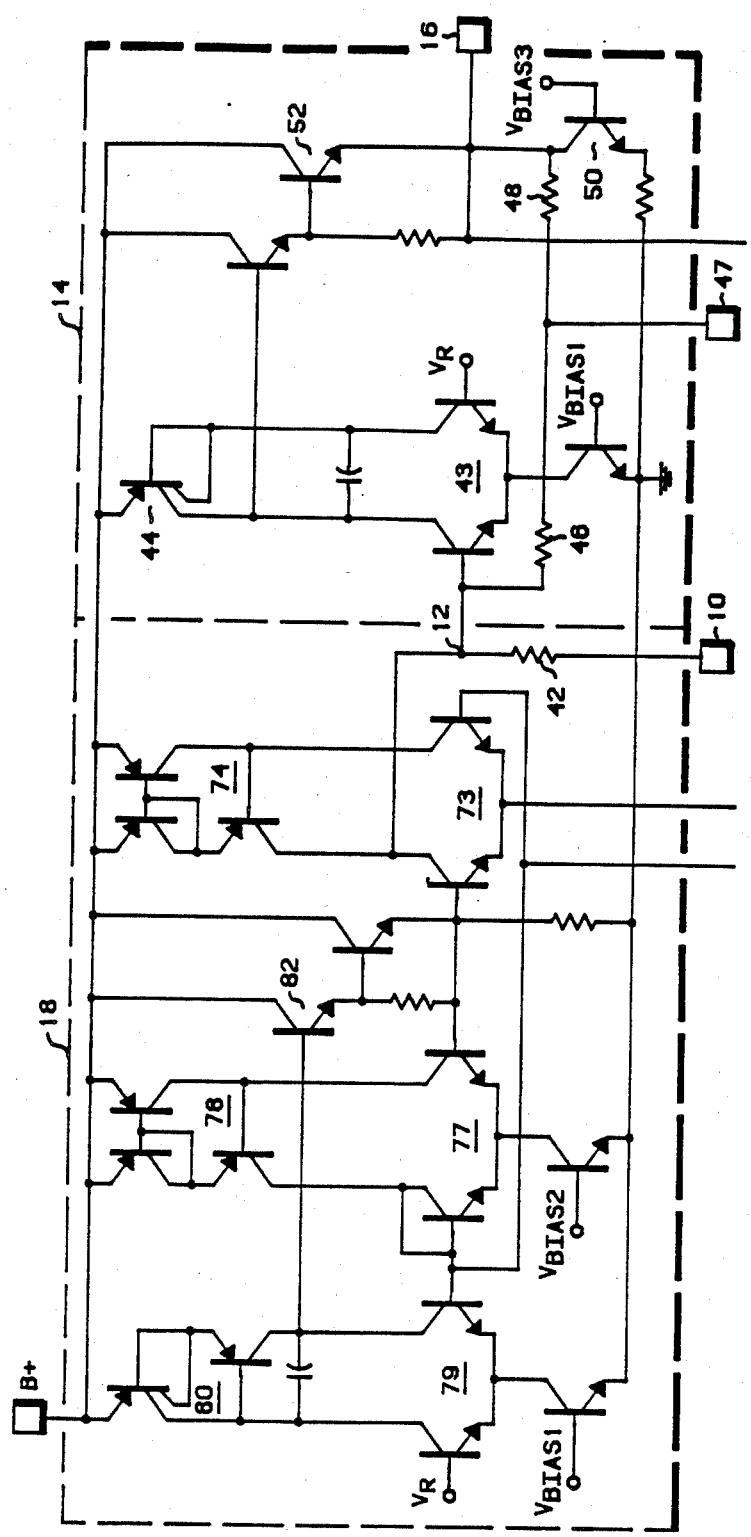
FIG. 3 is a detailed circuit diagram of a portion of the circuit of FIGS. 1 and 2.
Figure 5:
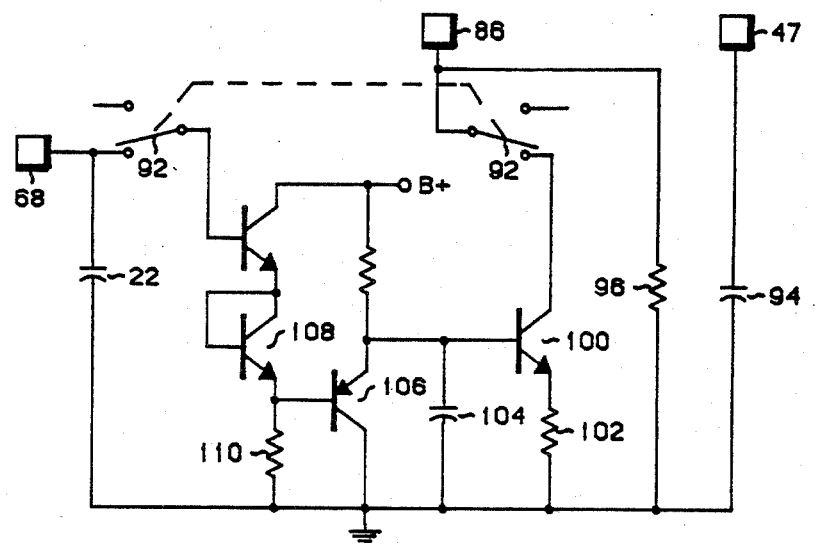
FIG. 5 is an alternate embodiment of the circuit of FIG. 4.

FIG. 3 is a detailed circuit diagram of an integrated circuit that realizes the block diagrams of FIGS. 1 and 2, and FIGS. 4 and 5 are circuit diagrams of certain external elements that complete the circuit of FIG. 3. In FIGS. 3, 4 and 5, corresponding elements are numbered according to their counterparts in FIGS. 1 and 2. Thus, in FIG. 3, terminal 10 is an audio input terminal which is connected through resistor 42 to a junction that comprises summer 12. Amplifier 14 includes a differential amplifier 43 connected to a current mirror 44 and buffer amplifier 52. The output of amplifier 14 provides stabilizing feedback to terminal 10 through resistors 46 and 48 and a capacitor to be connected at terminal 47. The term "current mirror" refers to any one of several kinds of circuits, also called current repeaters, all of which hold the current through an output transistor equal to that through an input transistor, but reverse its direction of flow. The current mirrors included in FIG. 3 are the simple current mirror and the Wilson or improved current mirror. The simple current mirror comprises a diode-connected first transistor connected to the base and emitter of a second transistor; in it, collector current in the first transistor equals collector current in the second. In a Wilson current mirror, a simple current mirror is combined with an added transistor that both biases a mirror transistor and also buffers the output. In either current mirror, the two transistors may be merged into a single split-collector device. In a split-collector device, the current through one portion of a split collector differs by a multiplicative constant from the current in the other portion of the split collector when the base and the other portion of the split collector are diode-connected. In what follows, each mirror will be identified by type.

Input signals from terminal 10 are also coupled through resistor 46, terminal 47, and resistor 48 to a transistor 50 which is a current source for a Darlington-connected emitter-follower buffer amplifier 52. An external connection to terminal 47 will be shown in FIGS. 4 and 5. The output of amplifier 14 is at terminal 16 which is also connected to terminal 54 of rectifier 20. Terminal 54 is connected through a resistor 56 to a Wilson current mirror 58 and current-follower transistor 64 that together serve as a full-wave current rectifier, held at the correct bias by feedback from differential amplifier 59. The signal from resistor 56 is also connected to a split-collector Wilson current mirror 60, the output of which is connected to a Darlington-connected emitter-follower buffer amplifier 62. Bias diodes 63 establish bias voltages in the circuit. Amplifier 62 is connected to transistor 64 and Wilson current mirror 66. Emitter-follower buffers 67 isolate parts of the circuit. The rectified current goes through current mirror 66 and resistor 70, producing a rectified audio voltage at terminal 68. To complete a syllabic filter, it will normally be desirable to connect a capacitor of the order of 1.0 microfarad between terminal 68 and ground. That capacitor is shown in FIGS. 4 and 5 because it is connected externally to the integrated circuit that is represented by FIG. 3.

The syllabic voltage at terminal 68 is coupled through resistor 70 to a Wilson current mirror 72, the output of which is coupled to a differential amplifier 73, then to a Wilson current mirror 74. This forms part of multiplier 18. A second input to multiplier 18 is taken from terminal 54 through resistor 76 to differential amplifiers 77 and 79. Terminals 54 and 16 are connected together. Differential amplifier 77 feeds current mirror 78 and differential amplifier 79 feeds current mirror 80. Current mirror 80 is connected to buffer amplifier 82 which drives differential amplifiers 77 and 73. The combination of differential amplifiers 73 and 77 and current mirrors 78 and 74 comprise a conventional multiplier, the output of which is taken from current mirror 74 to summing junction 12 to serve as a feedback input to amplifier 14. Differential amplifier 79, current mirror 80 and buffer amplifier 82 serve to maintain proper bias at the multiplier input. The portions of the circuit described so far comprise a syllabic compandor which compresses the volume of an audio signal. The syllabic current is also taken to comparator 24 through mirror 83 which is a combination of a simple current mirror and a cascode transistor. In comparator 24, a current-steering circuit 84 compares the output current of mirror 83 with a threshold current level at terminal 86. The current-steering circuit 84 is a combination of a differential amplifier, operated as a switch, and a buffering common-base amplifier. The output of current-steering circuit 84 drives a split-collector simple current mirror 85 which serves as a current comparator. The comparison, buffered by transistors 88 and 90, which are connected in common-emitter configurations, appears at terminal 28. The comparison current at terminal 86 will be made that of FIG. 1 or FIG. 2 by a choice of the connections in FIG. 4. The normal mode of operation of current steering circuit 84 is for transistor 89 to be active and transistor 87 to be inactive. This results when current is drawn from terminal 86. The alternate disabled mode occurs when terminal 86 is held at a potential greater than the base of transistor 89. The current from mirror 83 is then steered through transistor 87 and the comparator is disabled.

FIG. 4 shows two alternative arrangements for connection to terminals 68 and 86. Selection is made by double-pole-double-throw switch 92. When switch 92 is in the position shown in FIG. 4, the connections to terminals 68 and 86 achieve with FIG. 3 the circuit of FIG. 1. Thus, capacitor 22 is connected to terminal 68 to serve as a syllabic rectifying capacitor. Resistor 96 is connected to terminal 86. When it is desired to use the adaptive circuit of FIG. 2, switch 92 is thrown to the other position in FIG. 4, connecting resistor 98 to terminal 68 and connecting amplifier 100 to terminal 86. Resistor 102 in amplifier 100 is connected to ground and is selected to have approximately the same value of resistance as resistor 70. Capacitor 94 is also connected from terminal 47 to ground to cause amplifier 14 to have a high value of AC gain. The elements of FIG. 4 are here shown separately because they were, in fact, located apart from the integrated-circuit chip that has been built to embody FIG. 3. It will normally be desirable to circuit construction to make connections for capacitors 22, 94 and 104 of FIG. 4 that are not on a chip because of the difficulty of achieving relatively large values of capacitance on a chip. However, resistors 94, 98 and 102 and amplifier 100 could equally as well be achieved as part of an integrated circuit. Their location is a matter of design choice.

FIG. 5 is an alternate embodiment of the circuit of FIG. 4 in which the adaptive circuit uses valley detection instead of the averaging detection of FIG. 4. In FIG. 5, when double-pole-double-throw switch 92 is in the position shown, capacitor 22 is connected at terminal 68, and resistor 96 is connected to terminal 86. This achieves, with FIG. 3, the circuit of FIG. 2. However, in FIG. 5, amplifier 100, which controls the current through resistor 102, is driven by an amplifier 106, a common-collector stage which in turn is driven by an amplifier 108 that responds to a voltage from terminal 68. A resistor 110 is connected to the emitter of one transistor of amplifier 108. The resistors 102 and 110 are both selected to be approximately equal to each other and to resistor 70. FIG. 5 also shows a capacitor 94 connected to terminal 47 as in FIG. 4. The circuit of FIG. 4, when connected by switch 92, comprises an averaging detector, while the circuit of FIG. 5 comprises a valley detector. The use of one or the other is a matter of design choice.

We claim:

1. A circuit for compressing an audio signal from a signal source and for detecting a voice signal in the audio signal, the circuit comprising:
   a syllabic compressor for operating on the audio signal to produce a compressed output signal, said syllabic compressor comprising:
      a syllabic rectifier for receiving said compressed output signal and for producing an average envelope voltage comprising the average envelope of said compressed output signal;
      a multiplier for receiving said compressed output signal and said average envelope voltage and for providing a feedback signal; and
      a summer coupled to the signal source and said feedback signal to provide said compressed output signal;
   a reference source for producing a reference voltage; and
   a comparator coupled to the reference source and the syllabic compressor for comparing the average envelope voltage and the reference voltage and producing an output signal indicating that a voice signal is present in the auido signal when the average envelope voltage is greater than the reference voltage.

2. The circut according to claim 1, wherein said syllabic compressor further comprises an amplifier coupled to said summer for providing an amplified compressed output signal to said multiplier and said syllabic rectifier.

3. The circuit according to claim 2, wherein said circuit further includes a detector and a second summer interposed between the syllabic rectifier and the comparator, the detector coupled to the syllabic rectifier for producing a detected syllabic voltage, the second summer coupled to the detector and the reference source for producing a sum of the detected syllabic voltage and the reference voltage, and said comparator comprising the syllabic voltage from the syllabic rectifier and the sum of the detected syllabic voltage and the reference voltage to produce an output signal indicating that a voice signal is present when the syllabic voltage is greater than the sum of the rectified syllabic voltage and the reference voltage.

4. The circuit according to claim 3, wherein said detector is an averaging detector.

5. The circuit according to claim 3, wherein said detector is a valley detector.

6. A circuit for compressing an audio signal from a signal source and for detecting a voice signal in the audio signal, the circuit comprising:
   a syllabic compressor coupled to the audio signal from the signal source for producing a syllabic voltage;
   a detector coupled to the syllabic voltage from the syllabic compressor for producing an average envelope voltage;
   a reference source for producing a reference voltage;
   a summer coupled to the reference source and the detector for producing a sum of the reference voltage and the average envelope voltage; and
   a comparator coupled to the syllabic compressor and the summer for comparing the syllabic voltage and the sum of the reference voltage and the average envelope voltage to produce an output signal indicating that the voice signal is present in the audio signal when the syllabic voltage is greater than the sum of the reference voltage and the average envelope voltage.

7. The circuit according to claim 6, wherein said detector is an averaging detector.

8. The circuit according to claim 6, wherein said detector is a valley detector.

9. A method of compressing an audio signal from a signal source and detecting a voice signal in the audio signal the method comprising the steps of:
   subtracting a feedback voltage from the audio signal to produce a first sum signal;
   amplifying said first sum signal to produce an amplified first sum signal;
   filtering said amplified first sum signal to produce a syllabic voltage;
   multiplying said amplified first sum signal and said syllabic voltage to produce said feedback voltage signal;
   comparing said syllabic voltage and said reference voltage to produce an output signal indicating that a voice signal is present in the audio signal when the syllabic voltage is greater than the reference voltage.

10. A method of compressing an audio signal from a signal source and detecting a voice signal in the audio signal the method comprising the steps of:
    subtracting a feedback voltage signal from the audio signal to produce a first sum signal;
    amplifying said first sum signal to produce an amplified first sum signal;
    filtering said amplified first sum signal to produce a syllabic voltage;
    multiplying said amplified first sum signal and said syllabic voltage to produce said feedback voltage signal;
    detecting said syllabic voltage to produce a detected syllabic voltage;
    summing said detected syllabic voltage and said reference voltage to produce a second sum signal; and
    comparing said syllabic signal and said second sum signal to provide an output signal indicating that a voice signal is present when said syllabic voltage signal is greater than said second sum signal.

* * * * *

UNITED STATES PATENT AND TRADEMARK OFFICE
CERTIFICATE OF CORRECTION

PATENT NO. : 4,550,426
DATED : October 29, 1985
INVENTOR(S) : Gillig et al.

It is certified that error appears in the above-identified patent and that said Letters Patent is hereby corrected as shown below:

In claim 1, Col. 5, line 41, "auido" should be --audio--.

In claim 3, Col. 5, line 57, "comprising" should be --comparing--.

Signed and Sealed this

Twenty-eighth Day of January 1986

[SEAL]

Attest:

DONALD J. QUIGG

Attesting Officer    Commissioner of Patents and Trademarks